United States Patent [19]
Tallon et al.

[11] Patent Number: 5,646,094
[45] Date of Patent: Jul. 8, 1997

[54] RARE EARTH SUBSTITUTED THALLIUM-BASED SUPERCONDUCTORS

[76] Inventors: Jeffrey Lewis Tallon, 3 Marine Drive, York Bay, Eastbourne; Murray Robert Presland, 4/1 Mahina Bay Road, Mahina Bay, Eastbourne, both of New Zealand

[21] Appl. No.: 421,019

[22] Filed: Apr. 13, 1995

Related U.S. Application Data

[63] Continuation of Ser. No. 284,741, Aug. 2, 1994, abandoned, which is a continuation of Ser. No. 974,684, Nov. 12, 1992, abandoned, which is a continuation of Ser. No. 659,102, Feb. 21, 1991, abandoned.

[30] Foreign Application Priority Data

| | | | |
|---|---|---|---|
| Feb. 21, 1990 | [NZ] | New Zealand | 232633 |
| Apr. 27, 1990 | [NZ] | New Zealand | 233482 |
| Jun. 11, 1990 | [NZ] | New Zealand | 234014 |

[51] Int. Cl.$^6$ .......................... H01B 12/00; C04B 35/50
[52] U.S. Cl. .......................... 505/120; 505/783; 252/521
[58] Field of Search .................. 505/100, 120, 505/783; 252/518, 521

[56] References Cited

U.S. PATENT DOCUMENTS

| | | | |
|---|---|---|---|
| 4,894,361 | 1/1990 | Subramanian | 501/123 |
| 5,036,044 | 7/1991 | Hermann | 501/123 |
| 5,093,312 | 3/1992 | Itozaki | 505/783 |
| 5,462,922 | 10/1995 | Doi et al. | 505/120 |

FOREIGN PATENT DOCUMENTS

| | | | |
|---|---|---|---|
| 0368210 | 5/1990 | European Pat. Off. | 505/783 |
| 0116619 | 5/1990 | Japan | 505/783 |

OTHER PUBLICATIONS

Inoue "Superconductivity in a Tl-Sr-Y-Cu-O System". *Jap. Jnl. Appl Physics* v. 28(8) Aug. 1989 pp. L1375-L1377.
Mochiku "A new family of copper oxide compounds with a Tl-O . . . " *Jap. Jnl. Appl. Physics* v. 29(4) Apr. 1990 pp.L588-L590.
Liu "The fabrication and characterization of superconducting . . . " *Physica L* v. 159 1989.
Zhang "Effect of doping on properties . . . " *Wuli Xuaxue* 6(3) 1990 pp. 259-262.
Nagashina "Improving Superconductivity Characteristics . . . " *Jap. Jnl. Appl. Phys.* v. 28(6) Jun. 1987 pp. L930-933.
Liu "Resistive magnetic, and structural studies of . . . " *Appl. Phys. Lett* v. 55(19) Nov. 6, 1984 pp. 2029-2031.
Wu "Letter to Editor" *New Technology Week* Mar. 27, 1989 p. 3.

*Primary Examiner*—Paul Lieberman
*Assistant Examiner*—M. Kopec
*Attorney, Agent, or Firm*—Dann, Dorfman, Herrell and Skillman, P.C.

[57] ABSTRACT

The present invention comprises novel superconducting materials exhibiting superconductivity at temperatures exceeding 90 K. with chemical formula $Tl_aPb_bCa_cSr_dR_eCu_fO_g$ where R=Y or the lanthanide rare earth elements and where $0.3 \leq a,b \leq 0.7$, $0.05 \leq c \leq 1.1$, $2-c \leq d \leq 1.95$, $0.05 \leq e \leq 1$, $1.9 \leq f \leq 2.1$ and $6.5 \leq g \leq 7.5$. These compounds, which are layered perovskite-like oxides, exhibit a high chemical stability, form readily into nearly single phase, do not require adjustment of oxygen stoichiometry after synthesis and compositions may be chosen allowing superconductivity at temperatures exceeding 100 K. A preferred form of the superconducting materials is the range of compositions given by the chemical formula $$Tl_{0.5+x}Pb_{0.5-x}Ca_{1-y}Sr_{2-z}R_{y+z}Cu_2O_{7\pm\delta}$$

where $0 \leq x$, $8 \leq 0.3$, $0 \leq y \leq 0.95$, $0.05 \leq z \leq 1-y$ of which a preferred form is $$Tl_{0.5+x}Pb_{0.5-x}Ca_{0.8+x+z}Sr_{2-z}R_{0.2-x}Cu_2O_{7\pm\delta}$$

exemplified by $Tl_{0.5}Pb_{0.5}CaSr_{1.8}La_{0-2}Cu_2O_{7\pm\delta}$ where $0 \leq \delta \leq 0.1$.

2 Claims, 4 Drawing Sheets

RARE EARTH SUBSTITUTED THALLIUM-BASED SUPERCONDUCTORS

This application is a continuation of U.S. Ser. No. 08/284,741, filed Aug. 2, 1994, now abandoned which is a continuation of U.S. Ser. No. 07/974,684, filed Nov. 12, 1992, now abandoned which is continuation of U.S. Ser. No. 07/659,102, filed Feb. 21, 1991, now abandoned.

The present invention relates to rare earth substituted thallium-based superconductors.

A variety of high-Tc superconducting oxides have been discovered having superconducting transition temperatures Tc>77 K. (see R. J. Cava, Science 247 (1990) 656). These offer the possibility of commercial applications because of the ease and cheapness of liquid nitrogen refrigeration compared to liquid helium refrigeration as used by older conventional superconductors. Potential applications include magnets, magnetic screening, wires and cables for electrical power transmission, transformers, switches, current limiters, generators, motors, squids, electronics applications, mechanical bearings, medical body scanners and many others. These superconducting oxides include: $YBa_2Cu_3O_{7-\delta}$(1-2-3), $Y_2Ba_4Cu_7O_{15-\delta}$(2-4-7), $YBa_2Cu_4O_8$ (1-2-4), $Bi_2CaSr_2Cu_2O_8$, $Bi_2Ca_2Sr_2Cu_3O_{10}$, $Tl_mCaSr_2Cu_2O_{6+m}$ and $Tl_mCa_2Sr_2Cu_3O_{8+m}$ where m=1 or 2, and $Tl_{0.5}Pb_{0.5}CaSr_2Cu_2O_7$. Of these, all except 1-2-4 and $Tl_{0.5}Pb_{0.5}CaSr_2Cu_2O_7$ require oxygen loading or unloading following synthesis in order to optimise the superconductivity for maximum Tc. This is done by annealing at an appropriate temperature and oxygen partial pressure or by electrochemical insertion, for example. This annealing step is an added complication in the manufacturing process and for bulk, dense material the oxygen diffusion coefficient is sufficiently low that oxygen loading or unloading is prohibitively slow (see J. L. Tallon et al, Applied Physics Letters 52 (1988)507). The loading or unloading of oxygen is also instrumental in causing microcracking and it would be preferable to remove this step altogether (see D. R. Clark et al, J. Amer. Ceramic Soc. 72 (1989)1103). The said compounds which do not require oxygen loading, 1-2-4 and $Tl_{0.5}Pb_{0.5}CaSr_2Cu_2O_7$, have transitions of 80 K. and 83 K. respectively, too low to be useful at liquid nitrogen temperature, 77 K. All of these compounds which incorporate Ba tend to be chemically unstable. 2-4-7,1-2-4 and $Bi_2Ca_2Sr_2Cu_3O_{10}$ all have slow synthesis kinetics and require several days to synthesize. $Bi_2Ca_2Sr_2Cu_3O_{10}$ and the Tl compounds all are difficult to prepare as single phase material as shown by figure 1a in the Example 1.

The one material which does not require adjustment of oxygen stoichiometry (see J L Tallon et at, Physica C161 (1989)523), is chemically stable, and is rapidly synthesized (in a period of about two hours) is $Tl_{0.5}Pb_{0.5}CaSr_2Cu_2O_7$. This compound however is not so easily synthesized as a single phase and the Tc value is about 83 K.

The present invention provides novel rare earth substituted superconductors the chemical formula for which may be generally expressed as

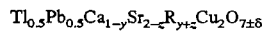

with R=Y or any of the lanthanide rare-earth elements and with $0 \leq y+z \leq 1$ but excluding z=0. Preferred compositions are given by $0.1 \leq y+z \leq 0.5$ of which a preferred composition is y+z=0.2.

In the material $Tl_{0.5}Pb_{0.5}CaSr_2Cu_2O_7$ the Tc value is low because the mean valence of Cu is too high, ie the hole carrier concentration is too high. The superconducting cuprates appear to have a general phase diagram which shows Tc as a function of hole concentration rising from zero, passing through a maximum then falling back to zero. It was believed that by reducing the hole concentration Tc in this compound should rise to a maximum and the stability of the compound should increase as the mean Cu valence is reduced towards the value 2.

It is known for the superconducting cuprates based on the perovskite structure that, in general, a rare earth element R, or Y, will substitute for Ca when Ca occupies a perovskite site with oxygen vacancies on the neighbouring sites in the a-b plane. Rare earth elements are also known to partially substitute for Sr and Ba in perovskite A-sites. In general Y and the rare earth elements of smaller atomic radius will substitute predominantly for Ca while the rare earth elements of larger atomic radius will substitute predominantly for Sr or Ba in a perovskite lattice.

In the present invention, and in an exemplary form, the hole concentration is reduced in $Tl_{0.5}Pb_{0.5}CaSr_2Cu_2O_7$ by substituting $La^{3+}$ in place of $Sr^{2+}$ giving the compounds 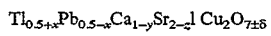 and as a consequence Tc is raised to a maximum over 100 K. At the same time the stability of the compound is evidently increased as the substituted compound is readily synthesized as a single phase. Preferred compositions are given by $0.1 \leq z \leq 0.5$ of which a preferred composition is z=0.2.

Finally, because in the parent compound $Tl_{0.5}Pb_{0.5}CaSr_2Cu_2O_7$ thallium is $Tl^{3+}$ while lead is $Pb^{4+}$ and they share the ideal Tl-sites, the hole concentration may be increased by raising the Tl-content and decreasing the Pb-content. This is exemplified below. It is also apparent then that, if in order to maximise $T_c$ the hole concentration must be reduced, it may equally be over-reduced by excessive rare-earth substitution then increased back to the optimum by concurrent excess thallium. Such compositions are described by the general chemical formula $$Tl_{0.5+x}Pb_{0.5-x}Ca_{1-y}Sr_{2-z}Cu_2O_{7\pm\delta}$$

where $0 \leq x$, $\delta < 0.3$, $0 \leq y \leq 0.95$, $0.05 \leq z \leq 1-y$. Preferred compositions are given by $0.1 \leq y+z-x \leq 0.5$ of which a preferred composition is y+z-x=0.2. One optimised example is

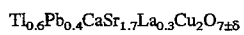

The compounds of the invention exhibit high chemical stability in contrast to compounds containing Ba, form readily into a single phase in contrast to the material $Tl_{0.5}Pb_{0.5}CaSr_2Cu_2O_7$ for example, do not require adjustment of oxygen stoichiometry after synthesis, and compositions may be chosen allowing superconductivity at temperatures exceeding 100 K.

The novel compounds described herein have the same tetragonal layered perovskite-like structure of the parent compound $Tl_{0.5}Pb_{0.5}CaSr_2Cu_2O_7$ comprising in sequence: a $Tl_{0.5}Pb_{0.5}O$ layer with Tl/Pb occupying square corner-shared sites and oxygen distributed about the face centre; a SrO layer with oxygen occupying the square corner-shared sites and Sr occupying the face-centre; a square planar $CuO_2$ layer with Cu occupying the corner-shared sites and oxygen the edge-shared sites; a Ca layer with Ca occupying the face centre and oxygen vacancies at the corner-shared sites; another CuO layer;, and finally another SrO layer to complete the cell.

The materials of the invention will be further described with reference to drawings and the examples which follow.

In the drawings that are referred to in the examples:

FIG. 1 shows the x-ray diffraction patterns, with impurity peaks marked by dots, for (a) $Tl_2Ca_2Sr_2Cu_3O_{10}$ prepared from a sample of nominal composition $TlCa_3SrCu_3O_y$; (b) a sample of nominal composition $Tl_{0.5}Pb_{0.5}CaSr_2Cu_2O_7$; and (c) a sample of composition $Tl_{0.5}Pb_{0.5}CaSr_{1.8}La_{0.2}Cu_2O_{7\pm\delta}$. This sample is very nearly single phase with only two small impurity peaks.

EXAMPLE 1

$Tl_{0.5}Pb_{0.5}CaSr_{1.8}La_{0.2}Cu_2O_{7+\delta}$ was prepared by first synthesizing $CaSr_{1.8}La_{0.2}Cu_2O_7$ using stoichiometric proportions of $Ca(NO_3)_2$, $La_2O_3$, and CuO which were mixed and milled then decomposed at 700° C. in air. The result was ground, milled and die-pressed into pellets and reacted at 820° C. for 16 hrs in air. The resultant ceramic was ground, milled and mixed with stoichiometric proportions of $Tl_2O_3$ and PbO, milled again and pressed as 13 mm diameter pellets. A pellet was placed in a gold bag in an atmosphere of oxygen, sealed by crimping and reacted for two hours at 950° C. in flowing oxygen. The gold bag was air-quenched upon removal and standard four terminal resistivity and a.c. susceptibility measurements were made followed by x-ray powder diffraction analysis.

Figure 1:
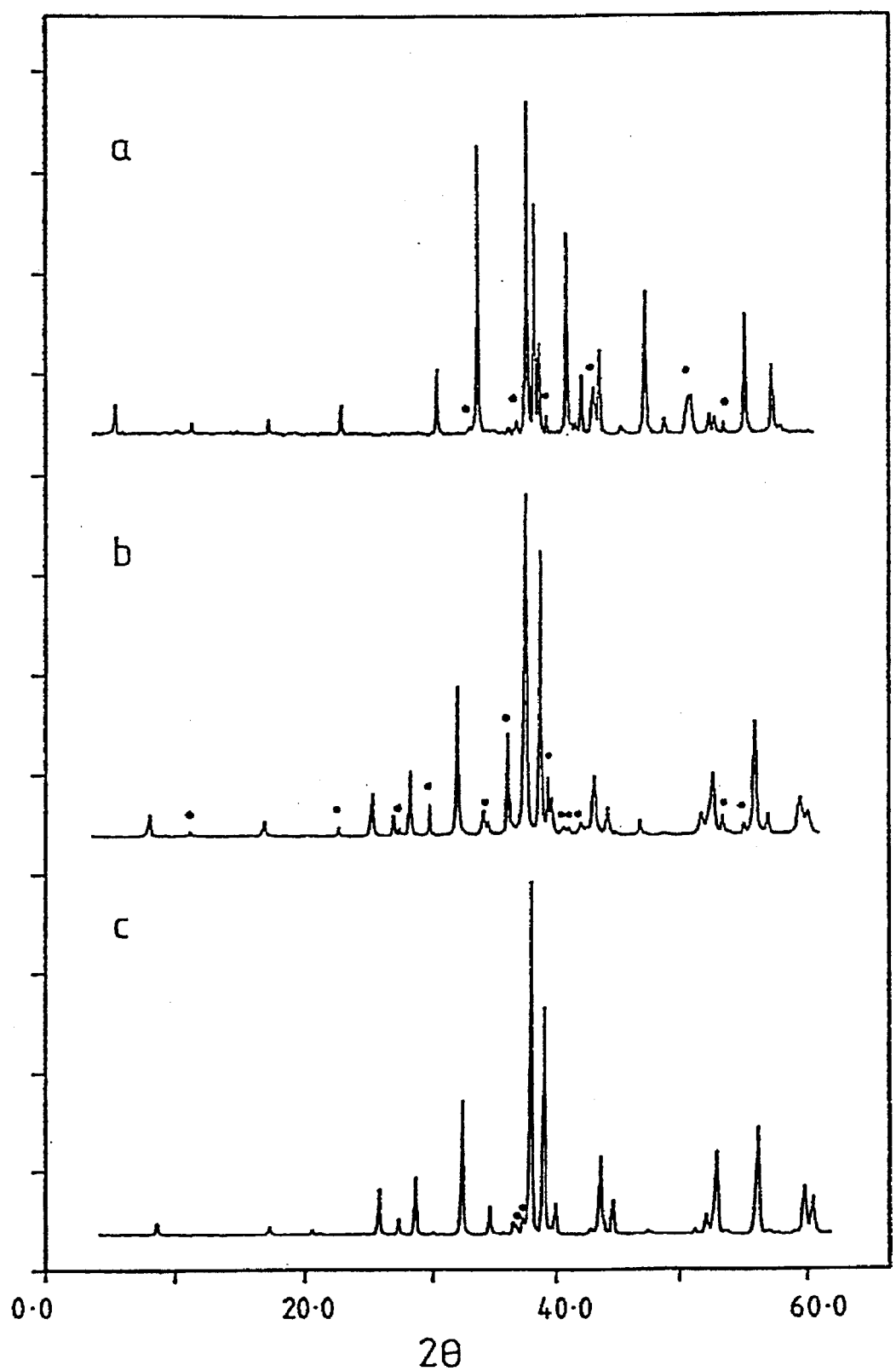

FIG. 1c shows the sample to be very nearly single phase $Tl_{0.5}Pb_{0.5}CaSr_{1.8}La_{0.2}Cu_2O_{7+\delta}$ in contrast to the unsubstituted compound in which impurity phases are usually found. FIG. 1b shows an x-ray diffraction pattern for $Tl_{0.5}Pb_{0.5}CaSr_2Cu_2O_7$ which illustrates the typical presence of impurity reflections marked by dots. The pattern for $Tl_{0.5}Pb_{0.5}CaSr_{1.8}La_{0.2}Cu_2O_{7+\delta}$ may be fitted on a tetragonal cell with lattice parameters a=0.3810nm and c=1.2106 nm.

Figure 2:
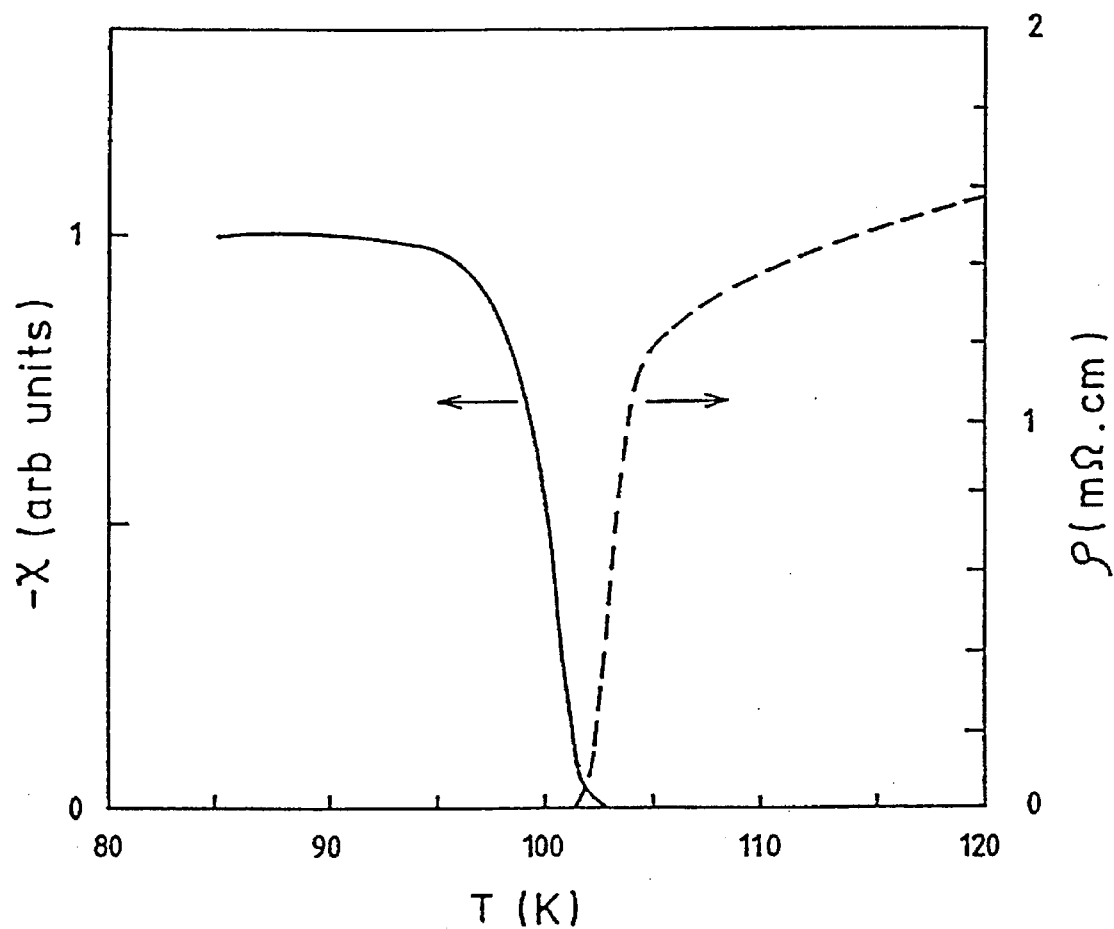
FIG. 2 shows the d.c. resistivity and a.c. susceptibility for a pellet of $Tl_{0.5}Pb_{0.5}CaSr_{1.8}La_{0.2}Cu_2O_{7\pm\delta}$ as functions of temperature.

The temperature dependence of the resistivity and a.c. susceptibility for this compound shown in FIG. 2 reveal that zero resistance and diamagnetism set in at 102 K. nearly 30 K. higher than for the unsubstituted compound $Tl_{0.5}Pb_{0.5}CaSr_2Cu_2O_7$. No effects on Tc were observed arising from subsequent annealing over a range of oxygen partial pressures of temperatures. Thus, contrary to most of the other compounds cited above, the oxygen stoichiometry is fixed and Tc is maximised solely by adjusting x, the amount of La substituted onto the Sr-site.

EXAMPLES 2 to 11

The series of materials $Tl_{0.5}Pb_{0.5}CaSr_{2-z}La_zCu_2O_{7+\delta}$, for z=0.1, 0.15, 0.20, 0.25, 0.3, 0.4, 0.5, 0.6, 0.7, 0.8 respectively, were prepared in a similar manner to example 1, but beginning by synthesizing $CaSr_{2-z}La_zCu_2O_5$. Pellets of each material were annealed in open gold boats for one hour at 700° C. in flowing oxygen and cooled to 200° C. over two hours in order to sharpen the transition to the superconducting state, as measured by a.c. susceptibility.

The materials were each shown to be nearly single phase by x-ray powder diffraction, and the patterns were all fitted on a primitive tetragonal unit cell.

Values of the superconducting transition temperatures and lattice parameters for all the examples are listed in Table 1.

TABLE 1

Superconducting transition temperatures, measured by the onset of diamagnetism, and tetragonal cell parameters for the series of materials $Tl_{0.5}Pb_{0.5}CaSr_{2-z}La_zCu_2O_{7\pm\delta}$.

| Example | z | $T_c$(K) | a(nm) | c(nm) |
|---|---|---|---|---|
| 2 | 0.1 | 98.5 | .3800 | 1.2095 |
| 3 | 0.15 | 106 | .3805 | 1.2097 |
| 4 | 0.2 | 107 | .3809 | 1.2095 |
| 5 | 0.25 | 106 | .3810 | 1.2090 |
| 6 | 0.3 | 106 | .3812 | 1.2082 |
| 7 | 0.4 | 94 | .3815 | 1.2073 |
| 8 | 0.5 | 96 | .3823 | 1.2060 |
| 9 | 0.6 | 83 | .3826 | 1.2052 |
| 10 | 0.7 | 59 | .3826 | 1.2020 |
| 11 | 0.8 | 33 | .3832 | 1.1962 |

EXAMPLES 12 to 14

Figure 3:
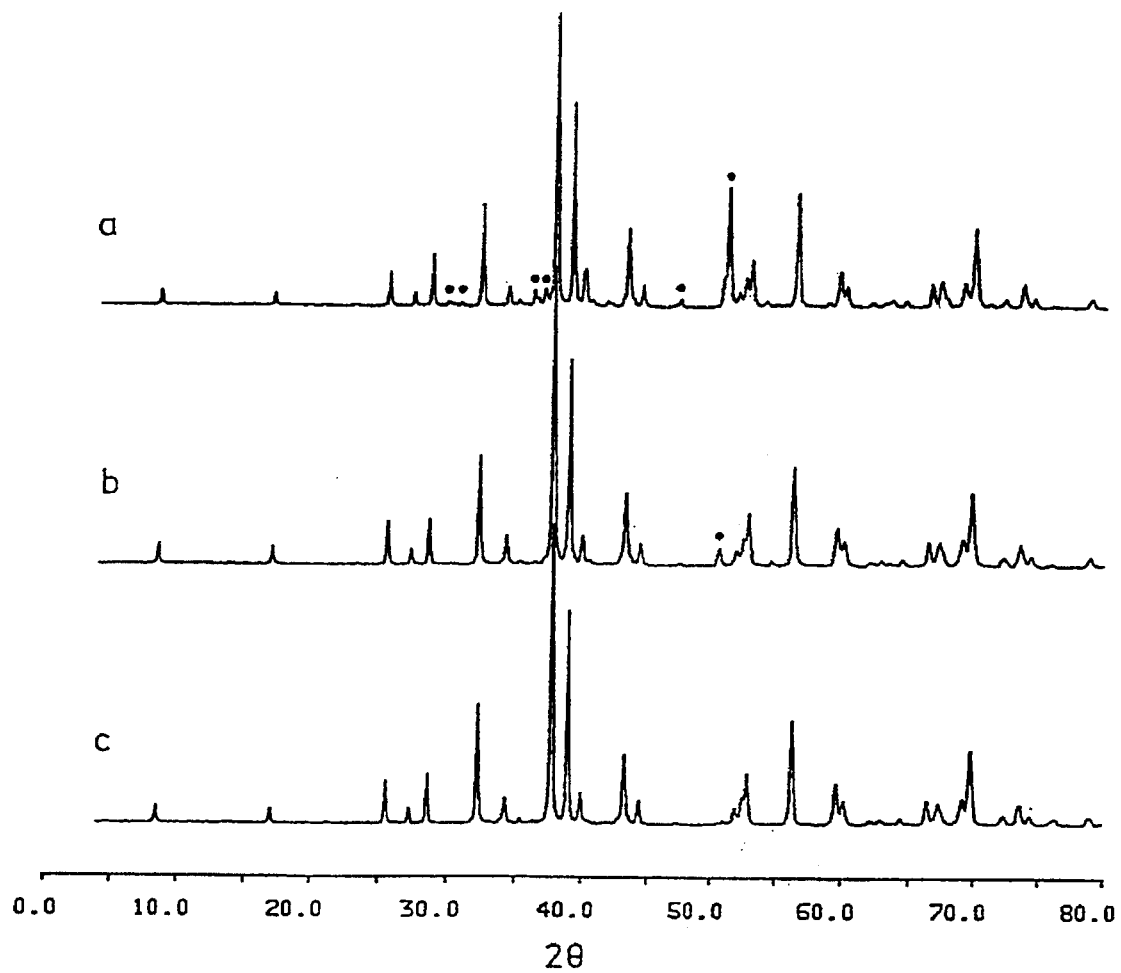
FIG. 3 shows the x-ray diffraction patterns for $Tl_{0.5+x}Pb_{0.5-x}CaSr_2Cu_2O_7$ with (a) x=0.3, (b) x=0.2 and (c) x=0.1. Impurity peaks are marked by dots.
Figure 4:
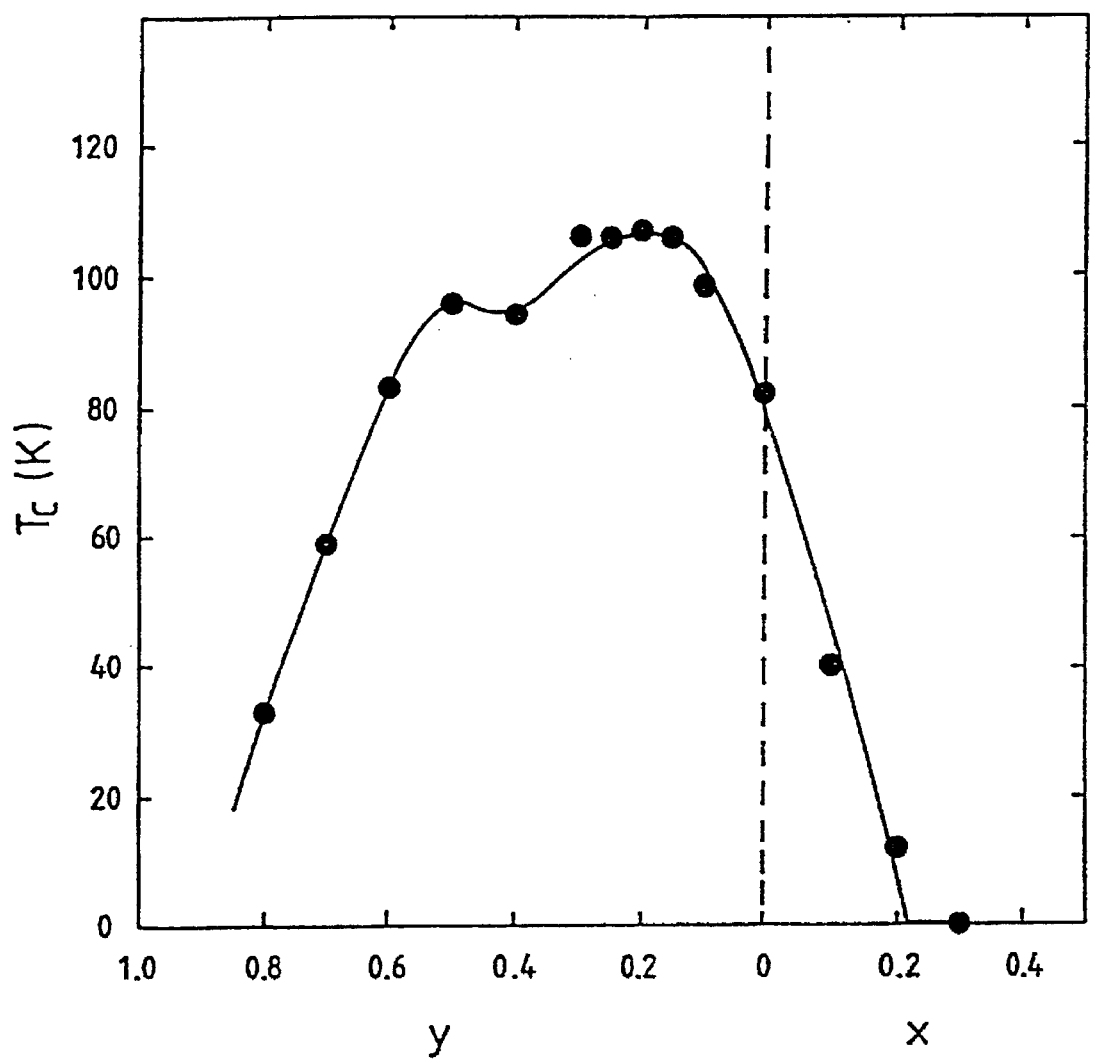
FIG. 4 shows $T_c(R=0)$ plotted against y and x for the compositions $Tl_{0.5}Pb_{0.5}CaSr_{2-y}La_yCu_2O_7$ and $Tl_{0.5+x}Pb_{0.5-x}CaSr_2Cu_2O_7$.

The series of materials $Tl_{0.5+x}Pb_{0.5-x}CaSr_2Cu_2O_7$ for x=0.1, 0.2 and 0.3 were prepared as in examples 2 to 11 but beginning by reacting precursors with a composition corresponding to $CaSr_2Cu_2O_5$ at 820° C. in air for 16 hours. Stoichiometric quantities of $Tl_2O_3$ and PbO were added, milled, and the mixture die-pressed into pellets. These were sealed under oxygen in gold bags and reacted for 3 hours at 950° C. in flowing oxygen. These were quenched, then the pellets annealed for one hour at 700° C. in flowing oxygen and cooled to 200° C. over 2 hours. The samples were investigated by x-ray diffraction and demonstrated to be nearly single phase as shown by the XRD patterns in FIG. 3. Superconducting transition temperatures, measured by onset of diamagnetism and zero electrical resistance are listed in Table 2 together with lattice parameters fitted on a tetragonal cell. FIG. 4 shows the $T_c$ data of Table 1 and Table 2 plotted against z and x. The increase in thallium content, as shown by the x-scale, causes a smooth fall in $T_c$ confirming that the hole concentration is increased by the excess thallium. It is obvious to deduce that by simultaneously adjusting x, y and z, namely the thallium excess, the Ca-substituted level and the Sr-substituted level respectively, $T_c$ may be maximised by, for example, ensuring y+z−x=0.2 .

TABLE 2

Superconducting transition temperatures, measured by the onset of diamagnetism, and tetragonal cell parameters for the series of zero resistance materials $Tl_{0.5+x}Pb_{0.5-x}CaSr_2Cu_2O_{7+\delta}$

| Example | x | $T_c(K)$ | a(nm) | c(nm) |
|---------|-----|----------|--------|--------|
| 12 | 0.1 | 41 | 0.3792 | 1.2127 |
| 13 | 0.2 | 23 | 0.3792 | 1.2148 |
| 14 | 0.3 | 0 | 0.3785 | 1.2144 |

The foregoing describes the invention including preferred forms and examples thereof. The preparation of derivative materials for forms other than sintered ceramic form, ie thin films, thick films single crystals, filaments and powders other than those specifically exemplified will be within the scope of those skilled in the art in view of the foregoing whether by plasma, vapour, liquid, sol gel or solid state deposition and reaction, for example. The scope of the invention is defined in the following claims.

What we claim is:

1. A material which exhibits high temperature superconductivity at above 101 K., of formula $$Tl_{0.5}Pb_{0.5}CaSr_{2-z}La_zCu_2O_7$$

wherein $0.15 \leq z \leq 0.3$.

2. A material according to claim 1 and of formula $$Tl_{0.5}Pb_{0.5}CaSr_{1.8}La_{0.2}Cu_2O_7.$$

* * * * *